United States Patent [19]

Sulzberger et al.

[11] Patent Number: 5,983,721
[45] Date of Patent: Nov. 16, 1999

[54] MICROMECHANICAL COMPONENT HAVING CLOSELY SPACED APART ANCHORING AREAS FOR A SURFACE STRUCTURE DISPOSED THEREON

[75] Inventors: Peter Sulzberger, Treuchtlingen; Michael Offenberg, Kirchentellinsfurt, both of Germany

[73] Assignee: Robert Bosch GmbH, Stuttgart, Germany

[21] Appl. No.: 08/940,140

[22] Filed: Sep. 29, 1997

[30] Foreign Application Priority Data

Sep. 27, 1996 [DE]  Germany ............................ 196 39 946

[51] Int. Cl.[6] ................................................. G01P 15/125
[52] U.S. Cl. ........................................ 73/514.32; 361/280
[58] Field of Search ........................... 73/514.32, 514.38, 73/514.18, 514, 24, 862.626; 361/280, 283.1

[56] References Cited

U.S. PATENT DOCUMENTS 5,025,346  6/1991  Tang et al. ............................ 73/DIG. 1
5,428,259  6/1995  Suzuki ................................... 310/309
5,763,782  6/1998  Moore et al. ......................... 73/514.18

FOREIGN PATENT DOCUMENTS

WO 92/03740  3/1992  WIPO .

OTHER PUBLICATIONS

William C. Tand et al., "Electrostatic Comb Drive Levitation and Control Method," *Journal of Micromechanical Systems*, vol. 1, No. 4, Dec. 1992, pp. 170–178, Dec. 1992.

*Primary Examiner*—John E. Chapman
*Attorney, Agent, or Firm*—Kenyon & Kenyon

[57] ABSTRACT

A micromechanical component includes a one-piece surface structure that is created on a substrate. The one-piece surface structure is attached to the surface of the substrate by at least two anchoring areas. The anchoring areas are a small distance apart, which is comparatively small in comparison with the lateral dimension of the surface structure. The surface structure has movable electrodes. Opposite them there are rigid electrodes that are attached to the substrate by additional anchoring areas. The additional anchoring areas also have a small distance between one another and to the anchoring areas.

7 Claims, 2 Drawing Sheets

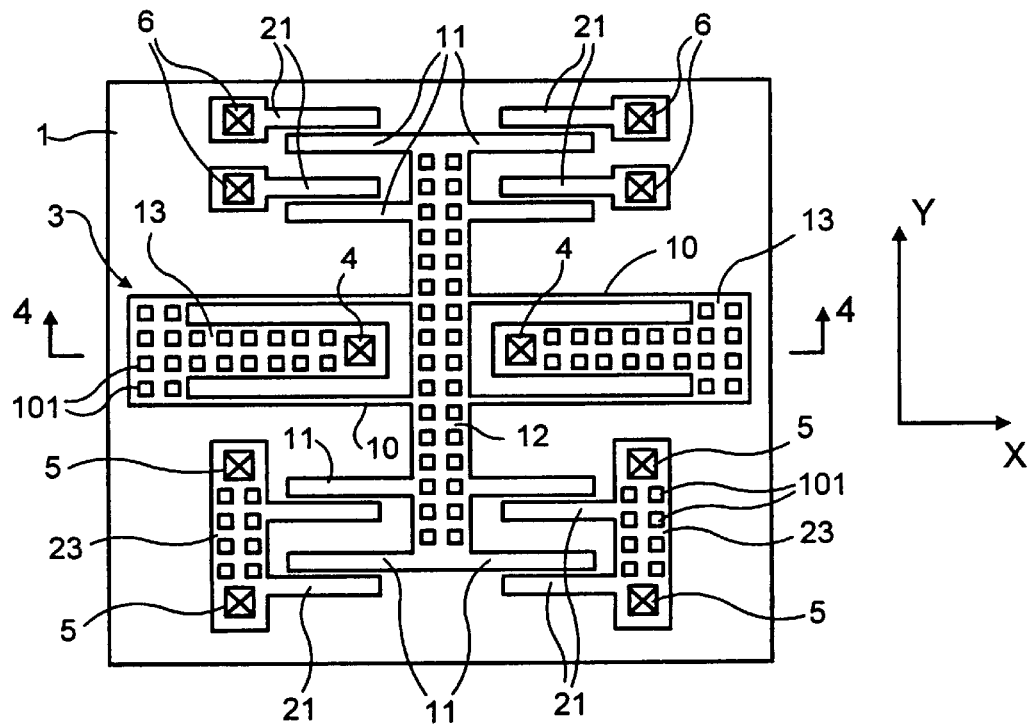
F I G. 2

MICROMECHANICAL COMPONENT HAVING CLOSELY SPACED APART ANCHORING AREAS FOR A SURFACE STRUCTURE DISPOSED THEREON

BACKGROUND INFORMATION

A micromechanical component having a plate-type substrate with a surface is described in PCT International No. WO 92/03740. An acceleration sensor is designed as the surface microstructure on the surface. The acceleration sensor has a one-piece movable element that is attached to the surface of the substrate by several connecting areas. The connecting areas are arranged on the outside ends of the one-piece movable surface structure. The movable structure has electrodes that are moved by an acceleration. In addition, stationary electrodes are provided, where each of these rigid stationary electrodes is arranged on the surface of the substrate via a single connecting area. These connecting areas are also arranged so that there are large distances between the connecting areas.

SUMMARY OF THE INVENTION

The micromechanical component according to the present invention is advantageous since mechanical stresses in the surface structure are reduced, particularly when different materials are used for the surface structure and for the substrate.

When there is a plurality of connecting areas, the heat characteristics of the component are improved by arranging all of the connecting areas with a relatively small distance between them; by using a movable element with movable electrodes and rigid electrodes, a micromechanical component usable for a variety of actuators or sensors is created. To further reduce thermal effects, the rigid electrodes should be secured using additional connecting areas that are spaced a small distance apart and are at a small distance from the connecting areas of the surface structure. Large and complete components can be implemented by using suspension bars.

In addition, a material that is under mechanical stress in itself can also be used to produce the surface structure.

BRIEF DESCRIPTION OF THE DRAWINGS

FIG. 2 shows a top view of a first embodiment of the micromechanical component according to the present invention.

DETAILED DESCRIPTION

Figure 1:
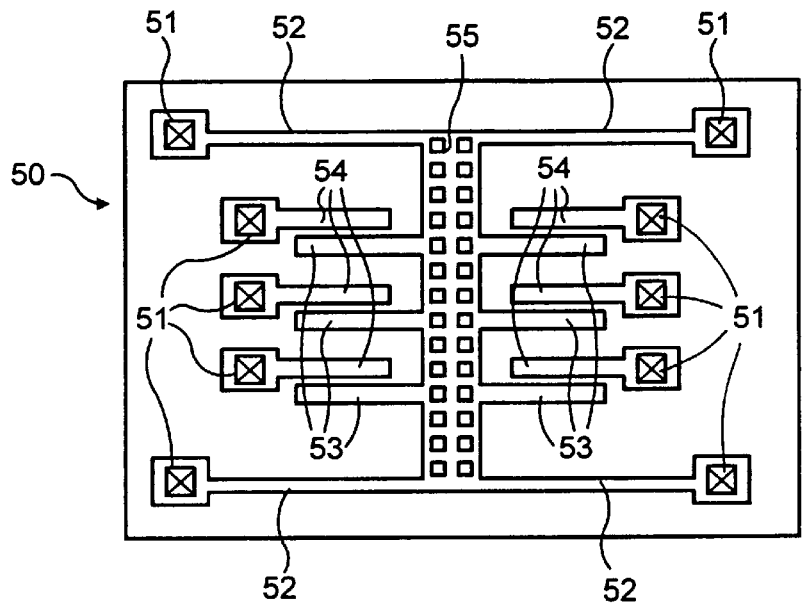
FIG. 1 shows a conventional micromechanical component.

FIG. 1 illustrates an acceleration sensor described in PCT International No. WO 92/03740. The sensor has a substrate 50 to which there is attached a surface structure. The surface structure consists of anchoring areas 51, attached bending tabs 52, attached central bars 55 and movable electrodes 53 attached to central bar 55. Movable electrodes 53 are arranged opposite rigid electrodes 54 which are connected to substrate 50 by separate anchoring areas 51. PCT International No. WO 92/03740 describes the operation of this acceleration sensor. The sensor has a one-piece surface structure formed by springs (or detachable bending tabs) 52, central bar 55 and movable electrodes 53. This one-piece surface structure extends with one lateral dimension over substrate 50 and is connected to substrate 50 at the outer ends of the lateral dimension by connecting areas 51. If the material for the surface structure differs from the material of the substrate, stresses may occur between the surface structure and substrate 50. Such stress can occur, for example, due to the fact that the substrate has a different thermal expansion coefficient than the material of the surface structure, or the material of the surface structure has been produced with internal stresses such as compressive stresses. Since springs 52 are comparatively the weakest elements, such mechanical stresses are dissipated preferentially in these areas, which can lead to deformation of springs 52. Additional mechanical stresses can occur due to assembly of the sensor element in a casing, e.g., by gluing or soldering.

Figure 4:
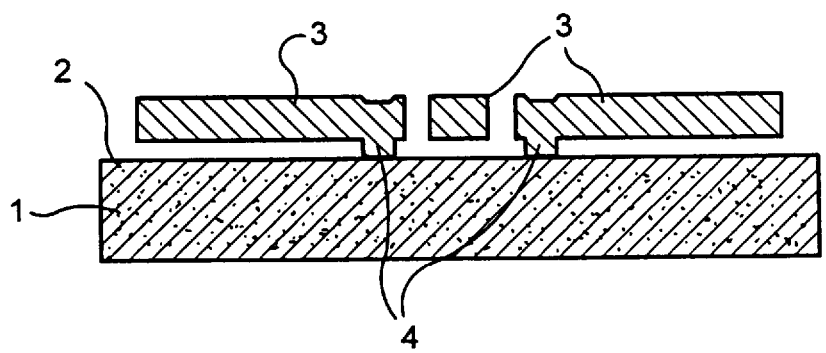
FIG. 4 shows a cross section along line I—I illustrated in FIGS. 2 and 3.

FIG. 2 shows a top view of a first embodiment of a micromechanical component according to the present invention having a substrate 1 and a surface structure 3 arranged on it. Surface structure 3 may be formed of a silicon material. FIG. 4 shows a cross section along line I—I in FIG. 2. As shown in FIG. 4, substrate 1 has a surface 2 to which surface structure 3 is applied by means of anchoring areas 4. As shown in FIG. 4, surface structure 3 is attached to surface 2 only through anchoring areas 4 and otherwise it is at a distance from surface 2. Surface structure 3 extends with a large lateral dimension over surface 2. As shown in FIG. 2, surface structure 3 has two connecting areas 4 to which there are two suspension bars 13 attached. Two springs 10 are attached to each suspension bar 13 (i.e., a total of four). These springs 10 are connected to a central bar 12 at the other end. Central bar 12 also extends over a wide area of surface 2 of substrate 1 and serves as a suspension for movable electrodes 11. Rigid electrodes 21 are arranged opposite movable electrodes 11 and are formed from a silicon material. One rigid electrode 21 is provided opposite each movable-electrode 11. Rigid electrodes 21 are either attached individually to surface 2 of substrate 1 with a separate anchoring area 6 or they are attached to suspension bars 23 which are then in turn attached to surface 2 of substrate 1 by anchoring area 5. The large-area structures such as suspension bars 13 and 23 or central bars 12 have etching holes 101 which permit unhindered access of an etching medium to the lower side of these structures in the production of the sensors. This simplifies undercutting by etching of these structures during manufacture.

Surface structure 3 has suspension bars 13, springs 10, a central bar 12 and movable electrodes 11 which together form a one-piece surface structure 3. The entire surface structure 3 is attached to surface 2 of the substrate only by anchoring areas 4, whereas the other elements are at a distance from surface 2. Therefore, these elements can be moved freely to the substrate. Due to the narrow design of flexible bars 10 that have an elongated structure in the x direction and have only a low rigidity in the y direction, a surface structure is created that is suitable as the movable electrode of an acceleration sensor or force sensor. When there is acceleration in a positive or negative y direction, a force acts on surface structure 3 that displaces central bar 12 and movable electrodes 11 suspended from it according to the acceleration relative to the substrate. Since the distance between movable electrodes 11 and stationary electrodes 21 changes, the acceleration can be detected by measuring the capacitance between stationary electrodes 11 and movable electrodes 21. The micromechanical component shown in FIG. 2 can thus be used as an acceleration sensor. In addition, it is also possible to apply electric voltages between movable electrodes 11 and stationary electrodes 21 and thus deflect surface structure 3 as a function of the applied voltage. In this case surface structure 3 would be used as the actuator.

Figure 3:
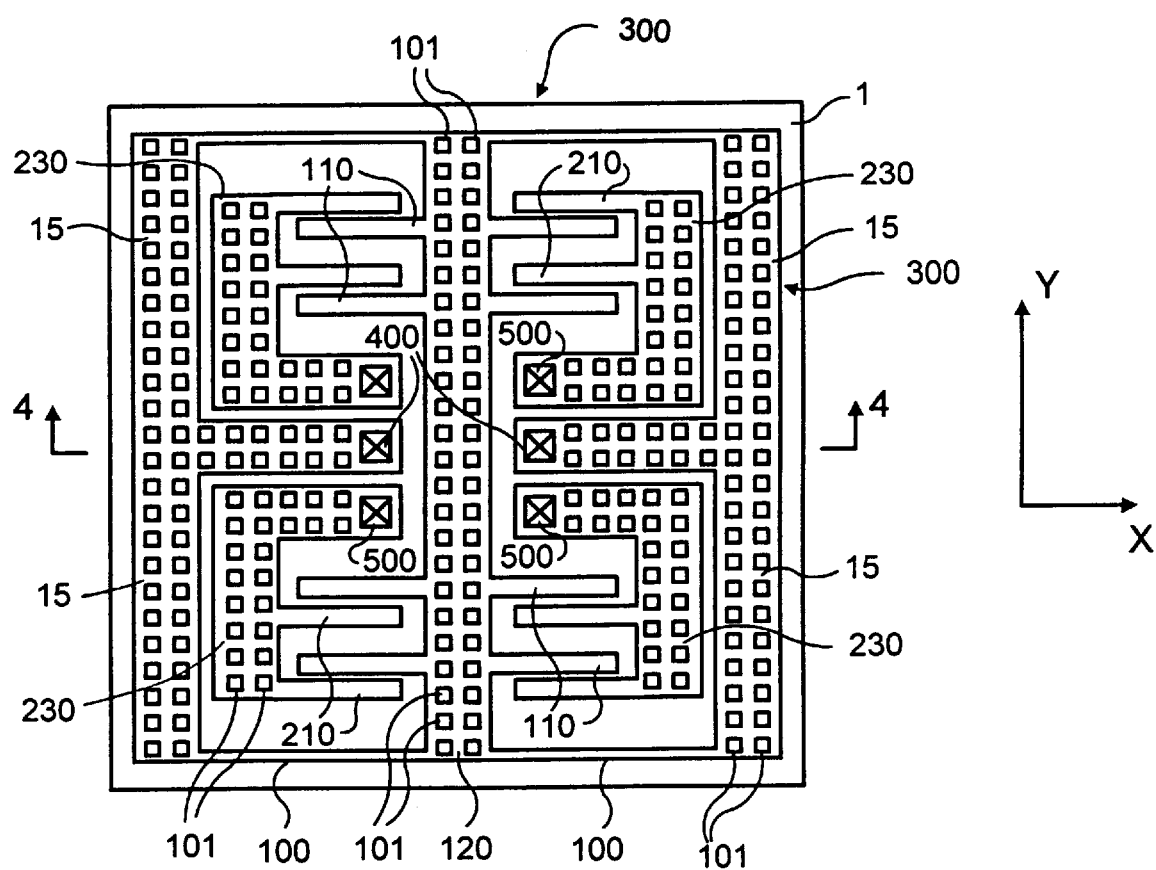
FIG. 3 shows a top view of a second embodiment of the micromechanical component according to the present invention.

In surface structure 3 illustrated in FIG. 2, the two anchoring areas 4 are arranged in immediate proximity to each other, with a small distance between the two anchoring areas in comparison with the lateral dimension of the surface structure. If surface structure 3 in FIG. 2 has a different thermal expansion coefficient from that of substrate 1 or the material for surface structure 3 has been produced with internal stresses, these thermal stresses or internal stresses can be dissipated in an unhindered manner by the expansion or contraction of surface structure 3. It is significant here that the distance between the two anchoring areas 4 is comparatively small and the additional components of one-piece surface structure 3 can move in any way relative to the substrate. The surface structure shown in FIG. 2 will thus essentially compensate for all the stresses that occur with an appropriate movement of surface structure 3, so that little or no internal force acts on surface structure 3. Although the sensor shown in FIG. 1 generates forces in springs 52 when substrate 50 and the surface structure have different thermal expansion coefficients, such forces are largely avoided in springs 10 of surface structure 3 shown in FIG. 2. Due to the use of anchoring areas 4 that have only a small relative distance from each other, the properties of the micromechanical component with respect to temperature or manufacturing-induced stresses are thus improved. As shown in FIG. 2, anchoring areas 4 for one-piece surface structure 3 are arranged in immediate proximity to each other, so that mechanical stresses cannot occur within the one-piece surface structure 3. However, anchoring areas 4 are at a great distance from anchoring areas 5 and 6 of rigid electrodes 21. Therefore, the relative distances between movable electrodes 11 and stationary electrodes 21 can change, for example, when the length of central bar 12 changes more or less due to a change in temperature than the corresponding expansion of substrate 1. FIG. 3 shows a second embodiment of the micromechanical component according to the present invention where these effects are also compensated.

FIG. 3 shows a micromechanical component with a substrate 1 and a one-piece surface structure 300 arranged thereon. The one-piece surface structure has anchoring areas 400 with which one-piece surface structure 300 is attached to surface 2 of substrate 1. Suspension bars 15 are attached to the two anchoring areas 400 and extend to the outer corners of surface structure 300. To these end points there are in turn attached springs 100 which have a central bar 120 at their other end. Central bar 120 in turn has movable electrodes 110. Opposite movable electrodes 110 there are arranged rigid electrodes 210 which are in turn attached to suspension bars 230. Suspension bars 230 are connected to surface 2 of substrate 1 by connecting area 500. FIG. 4 also shows a cross section along line I—I in FIG. 3. As shown in FIG. 3, anchoring areas 400 and 500, which connect the one-piece surface structure 300 (consisting of open bars 15, springs 100 central bars 120 and movable electrodes 110) and the rigid electrodes with suspension bars 230 to the substrate, are all arranged in immediate proximity to each other. Any possible distance between two of the anchoring areas 400, 500 is small in comparison with the total lateral dimension of the micromechanical component. For example, if the material of substrate 1 expands much more than the materials used for suspension bars 15, 230 when heated, then the relative distance of movable electrodes 110 relative to stationary electrodes 210 changes only insignificantly nevertheless, and the relative change is even less, the closer anchoring areas 400 are arranged relative to anchoring areas 500. Stresses can occur in the x direction only to the extent that the two anchoring areas 400 on the right and left sides of the micromechanical components are separated from each other. The smaller the distance between the two anchoring areas 400, the smaller are the stresses occurring in the x direction. Similarly, the distances between anchoring areas 400 and 500 in the y direction are relevant for the relative displacements between rigid electrodes 210 and movable electrodes 110. The smaller these distances in the y direction, the smaller are the displacements between the electrodes.

What is claimed is:

1. A micromechanical component, comprising:
   at least two anchoring areas;
   a substrate configured as a plate having a surface;
   a one-piece surface structure coupled to the surface via the at least two anchoring areas, the one-piece surface structure extending over the surface for a lateral extension of the one-piece surface structure and at a first predetermined distance from the surface, wherein the one-piece surface structure includes movable electrodes and springs, the movable electrodes being suspended on the springs and being movable relative to the substrate; and
   rigid electrodes positioned opposite to the movable electrodes and being immovable relative to the substrate,
   wherein a first anchoring area of the at least two anchoring areas is arranged at a second predetermined distance from a second anchoring area of the at least two anchoring areas, the second predetermined distance being small relative to the lateral extension of the one-piece surface structure, and wherein the rigid electrodes are attached to the surface of the substrate using connecting areas, a first connecting area of the connecting areas being positioned at a third predetermined distance from a second connecting area of the connecting areas, the connecting areas being positioned at a fourth predetermined distance from the at least two anchoring areas, the third and fourth predetermined distances being small relative to the lateral extension of the one-piece surface structure.

2. The micromechanical component according to claim 1, wherein the springs are connected to the at least two anchoring areas via suspension bars.

3. The micromechanical component according to claim 1, wherein the one-piece surface structure is composed of a silicon material.

4. The micromechanical component according to claim 1, wherein the rigid electrodes are composed of a silicon material.

5. The micromechanical component according to claim 1, wherein the micromechanical component corresponds to a force sensor.

6. The micromechanical component according to claim 1, wherein the micromechanical component corresponds to an acceleration sensor.

7. A micromechanical component, comprising:
   at least two anchoring areas;
   a substrate configured as a plate having a surface;
   a one-piece surface structure coupled to the surface via the at least two anchoring areas, the one-piece surface structure extending over the surface for a predetermined lateral extension of the one-piece surface structure and at a first predetermined distance from the surface, wherein the one-piece surface structure includes movable electrodes and springs, the movable electrodes being suspended on the springs and being movable relative to the substrate; and rigid electrodes positioned opposite to the movable electrodes and being immovable relative to the substrate, wherein a first anchoring area of the at least two anchoring areas is arranged at a second predetermined distance from a second anchoring area of the at least two anchoring areas, the second predetermined distance being smaller than the predetermined lateral extension of the one-piece surface structure, wherein the rigid electrodes are attached to the surface of the substrate using connecting areas, a first connecting area of the connecting areas being positioned at a third predetermined distance from a second connecting area of the connecting areas, the connecting areas being positioned at a fourth predetermined distance from the at least two anchoring areas, the third and fourth predetermined distances being smaller than the predetermined lateral extension of the one-piece surface structure, and wherein the rigid electrodes are connected to the connecting areas via suspension bars.

* * * * *